(12) United States Patent
Mercier

(10) Patent No.: US 6,870,417 B2
(45) Date of Patent: Mar. 22, 2005

(54) CIRCUIT FOR LOSS-LESS DIODE EQUIVALENT

(75) Inventor: Claude Mercier, Baie-Comeau (CA)

(73) Assignee: Siemens Milltronics Process Instruments, Inc., Peterborough (CA)

(*) Notice: Subject to any disclaimer, the term of this patent is extended or adjusted under 35 U.S.C. 154(b) by 0 days.

(21) Appl. No.: 10/409,048

(22) Filed: Apr. 9, 2003

(65) Prior Publication Data

US 2004/0201413 A1 Oct. 14, 2004

(30) Foreign Application Priority Data

Apr. 4, 2003 (CA) .............................................. 2424473

(51) Int. Cl.⁷ .............................................. H03K 17/74
(52) U.S. Cl. ........................ 327/493; 327/531; 327/343
(58) Field of Search ................................ 327/493, 104, 327/343, 419–421, 427, 524, 531, 538, 541, 543, 583, 584

(56) References Cited

U.S. PATENT DOCUMENTS

| 4,500,798 A | * | 2/1985 | Pike ............................ 327/574 |
| 4,678,947 A | * | 7/1987 | Huijsing et al. ............... 327/50 |
| 5,506,527 A | * | 4/1996 | Rudolph et al. ............. 327/104 |
| 5,561,383 A | * | 10/1996 | Rogers ......................... 327/61 |
| 5,821,797 A | * | 10/1998 | Kinugasa et al. ........... 327/318 |
| 6,060,943 A | * | 5/2000 | Jansen ......................... 327/538 |
| 6,075,399 A | * | 6/2000 | Voldman et al. ............ 327/309 |
| 6,430,071 B1 | * | 8/2002 | Haneda ....................... 363/127 |
| 6,747,800 B1 | * | 6/2004 | Lin ............................. 359/585 |

* cited by examiner

Primary Examiner—Timothy P. Callahan
Assistant Examiner—Hai L. Nguyen
(74) Attorney, Agent, or Firm—Harness, Dickey & Pierce, P.L.C.

(57) ABSTRACT

A loss-less diode equivalent circuit which functions to reduce and eliminate the forward bias voltage or drop associated with conventional diodes. The loss-less diode comprises a reverse connected MOSFET device which is configured with a clamping circuit and coupled to an input stage. The drain is coupled to the input stage which receives an input signal. The source of the MOSFET device provides an output port for charging a capacitor in a conduction or on state.

16 Claims, 3 Drawing Sheets

CIRCUIT FOR LOSS-LESS DIODE EQUIVALENT

FIELD OF THE INVENTION

The present invention relates to electronic circuits, and more particularly to an equivalent circuit for a loss-less diode.

BACKGROUND OF THE INVENTION

Diodes are found in many types of electronic circuits and integrated circuits. Diodes come in all sizes, ranging from small signal semiconductor diodes to large high voltage diodes and power generation diodes.

For example, reference is made to FIG. 1 which shows a circuit indicated generally by reference 10 for charging a capacitor 20. A resistor 42 and a capacitor 44 provide a filtered reference at point 52 for the transistor 40 (on its base). The voltage at point 54 will be 0.7 V less than the input voltage 50 (on average). If a positive transient appears at input 50, the voltage at point 54 won't change because of the filter comprising the resistor 42, the capacitor 44 and the transistor 40. A diode 60 prevents the capacitor 20 from discharging through the emitter-collector junctions of the transistor 40 when the voltage at the input 50 falls down under the voltage stored in the capacitor 20.

For the circuit 10 of FIG. 1, the diode 60 functions as unipolar switch or gate with an ON and an OFF state. In the OFF state, the diode blocks the flow of current, and in the ON state the current flows. In the OFF state, the diode looks like an open circuit. In the ON state the diode looks like a closed or short circuit, however, there is a voltage drop, known as the forward bias voltage, when the diode is turned in ON. The forward bias voltage is typically in the range of 0.7 Volts, for a silicon diode and 0.2 V for a Schottky diode.

Ideally a diode would have no forward voltage drop. Since this is not the case, the forward bias voltage needs to be taken account in most circuit designs, and this presents an additional design constraint or factor. For example, in the context of the circuit 10 of FIG. 1, the forward bias voltage drop of the circuit 10 is a factor together with the temperature coefficients of the junctions of the transistor 40 and the diode 60 for which a typical junction will be in the range of −2.7 mV/C.

Accordingly, it would be advantageous to have a diode equivalent circuit which does not exhibit the forward drop voltage characteristics of conventional diodes.

BRIEF SUMMARY OF THE INVENTION

The present invention provides a diode equivalent circuit which is loss-less and does not exhibit a pronounced forward voltage drop.

In a first aspect, the present invention provides a loss-less diode circuit comprising: (a) an input stage having an input port and an output node, said input port being adapted for receiving an input signal; (b) a diode equivalent circuit having an input, said input being coupled to said output node, said diode equivalent circuit including a reverse connected field effect transistor having a first terminal forming said input coupled to said output node, a second terminal forming an output, and a third terminal providing a control input, and said field effect transistor having a diode providing a conduction path between said first and said second terminals when said field effect transistor is in an off state; (c) said diode equivalent circuit including a clamping device, said clamping device being coupled to the third terminal of said field effect transistor and providing a clamping voltage to protect said third terminal; and (d) the second terminal of said field effect transistor providing an output port for said circuit, and said output port being adapted for coupling to a capacitor and said capacitor being charged by the input signal applied to said input port.

In a further aspect, the present invention provides a loss-less diode circuit comprising: (a) an input stage having an input port and an output node, said input port being adapted for receiving an input signal; (b) a diode equivalent circuit having an input, said input being coupled to said output node, said diode equivalent circuit including a reverse connected MOSFET device, said MOSFET device having a drain, a source and a gate, said drain being coupled to said output node, said gate being coupled to signal ground through a resistor, and said MOSFET device including an internal diode coupled between said drain and said source and providing a conduction path when said MOSFET device is in an off state; (c) said diode equivalent circuit including a Zener diode and a bipolar junction transistor, said Zener diode having a cathode and an anode, said cathode being coupled to the source of said MOSFET device, said anode being coupled to the anode of said Zener diode, and said bipolar junction transistor having an emitter, a collector and a base, said emitter being coupled to said cathode and the source of said MOSFET device, and said collector being coupled to said anode and the gate of said MOSFET device; and (d) the source of said MOSFET device providing an output port for said circuit, and said output port being adapted for coupling to a capacitor and said capacitor being charged by the input signal applied to said input port.

In another aspect, the present invention provides a loss-less diode circuit comprising: (a) an input stage having an input port and an output node, said input port being adapted for receiving an input signal; (b) a diode equivalent circuit having an input, said input being coupled to said output node, said diode equivalent circuit including a reverse connected MOSFET device, said MOSFET device having a drain, a source and a gate, said drain being coupled to said output node, said gate being coupled to signal ground through a resistor, and said MOSFET device including an internal diode coupled between said drain and said source; (c) said diode equivalent circuit including a bipolar junction transistor, said bipolar junction transistor having an emitter, a collector and a base, said collector being coupled to the source of said MOSFET device, and said emitter being coupled to the gate of said MOSFET device; and (d) the source of said MOSFET device providing an output port for said circuit, and said output port being adapted for coupling to a capacitor and said capacitor being charged by the input signal applied to said input port.

Other aspects and features of the present invention will become apparent to those ordinarily skilled in the art upon review of the following description of specific embodiments of the invention in conjunction with the accompanying drawings.

BRIEF DESCRIPTION OF THE DRAWINGS

Reference is next made to the accompanying drawings which show, by way of example, embodiments of the present invention and in which.

DETAILED DESCRIPTION OF EMBODIMENTS OF THE INVENTION

Figure 2:
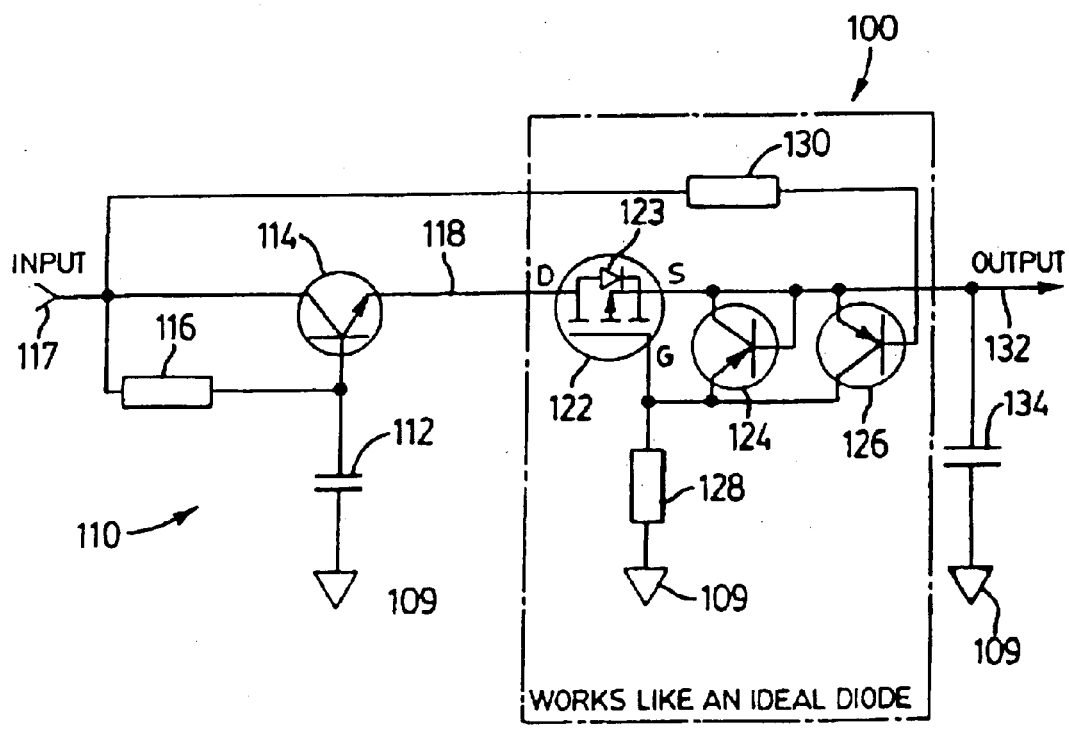
FIG. 2 is a schematic diagram showing a loss-less diode equivalent circuit in the context of a filter circuit application.

Reference is made to FIG. 2 which shows in schematic form a loss-less diode equivalent circuit according to the present invention. The loss-less diode equivalent circuit is indicated generally by reference 100.

The diode equivalent circuit 100 in FIG. 2 is shown in the context of a filter circuit. The filter circuit is indicated generally by reference 110 and comprises a capacitor 112, a NPN bipolar junction transistor 114 and a resistor 116. The filter circuit 110 is configured as a low pass filter, and a signal 108 to be filtered is applied at an input port 117 and the filtered output signal is outputted at output terminal or node 118.

As shown in FIG. 2, the resistor 116 is coupled across the collector-base junction of the transistor 114 and one terminal of the resistor 116 and the collector terminal of the transistor 114 form the input 117. One terminal of the capacitor 112 is coupled to the base of the transistor 114 and the other terminal of the capacitor 112 is coupled to signal ground 109.

Referring to FIG. 2, the diode equivalent circuit 100 comprises a MOSFET transistor 122, a first PNP transistor 124 and a second PNP transistor 126, and two resistors 128 and 130. The MOSFET 122 comprises a P-channel device and is connected in reverse, i.e. the drain terminal is coupled to the output terminal 118, and the source terminal of the MOSFET 122 is coupled to the collector of the first PNP transistor 124 and the emitter of the second PNP transistor 126. The MOSFET 122 includes an internal diode 123 which is coupled across the drain and source of the device. The gate terminal of the MOSFET 122 is coupled to the emitter of the first PNP transistor 124 and the collector of the second PNP transistor 126. The gate terminal of the MOSFET 122 is also coupled to one terminal of the resistor 128, and the other terminal of the resistor 128 is coupled to signal ground 109. The base of the second PNP transistor 126 is coupled to one terminal of the resistor 130. The other terminal of the resistor 130 is connected to the input port 117. As shown in FIG. 2, the base terminal for the first PNP transistor 124 is coupled to its collector terminal, and the first PNP transistor 124 is a diode-connected transistor.

As also shown in FIG. 2, the emitter for the second PNP transistor 126 forms an output terminal or port for the circuit and is indicated by reference 132. A capacitor 134 is coupled across the output port 132 and the signal ground 109.

As will be described in greater detail below, the diode equivalent circuit 100 functions as an ideal diode, i.e. negligible forward bias or drop voltage, and the terminal 118 functions as the anode and the output terminal 132 functions as the cathode.

When the input voltage signal applied at the input port 117 is higher than the gate threshold voltage for the MOSFET 122, the peak value of the input voltage signal is stored on the capacitor 134. In operation, if the input voltage level is higher than the voltage level on the capacitor 134, then the NPN transistor 114 turns on and creates a 0.7 Volt drop across the collector and emitter junctions. With the NPN transistor 114 on, current flows through the internal diode 123 in the MOSFET 122, and the resistor 128 coupled to the MOSFET 122 pulls down the voltage on the gate causing the MOSFET 122 to turn on. When turned on the MOSFET 122 looks like a short circuit. The diode-connected (i.e. reverse connected base-emitter) BJT transistor 124, coupled to the source of the MOSFET 122 functions as a Zener diode. Specifically, the BJT transistor 124 functions as a low leakage and Low knee current Zener diode to protect the gate of the MOSFET 122. The BJT transistor 124 is selected and configured to limit, i.e. clamp, the voltage around 10 Volts. If the transistor 124 is selected to produce a low knee current as a Zener diode (i.e. the base-emitter junction), the resistor 128 can have a high value in range of 10 MegaOhms which further reduces circuit losses. Because of the high resistance value possible for the resistor 128, it is easy for the MOSFET 122 to pull up the resistor 128, and as a result the resistor 130 can have a high resistance value, typically around 1 MegaOhm.

Referring still to FIG. 2, if the voltage level of the input signal at the input port 117 is reduced, the capacitor 134 would discharge would it not be for the diode equivalent circuit 100. The diode equivalent circuit has a cathode formed from the output terminal 132 and an anode formed from the terminal 118. As a result, the voltage level for the input signal may be reduced without discharging the capacitor 134. When the voltage at the input port 117 is 0.7 Volts lower than the voltage at the output port 132, then the PNP transistor 126 turns on and the MOSFET 122 turns off. With the MOSFET 122 turned off, the internal MOSFET diode 123 is the only internal conduction path. It will be appreciated that the MOSFET diode 123 will have a forward bias or voltage drop, but the circuit 100 as described above serves to limit any further losses.

Figure 1:
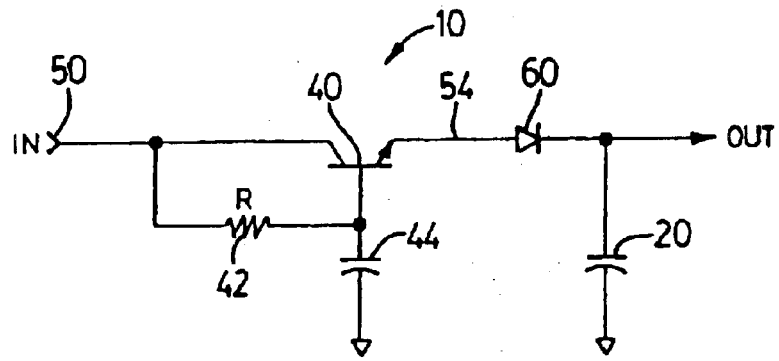
FIG. 1 is a schematic diagram showing a capacitor charging circuit with a conventional blocking diode.
Figure 3:
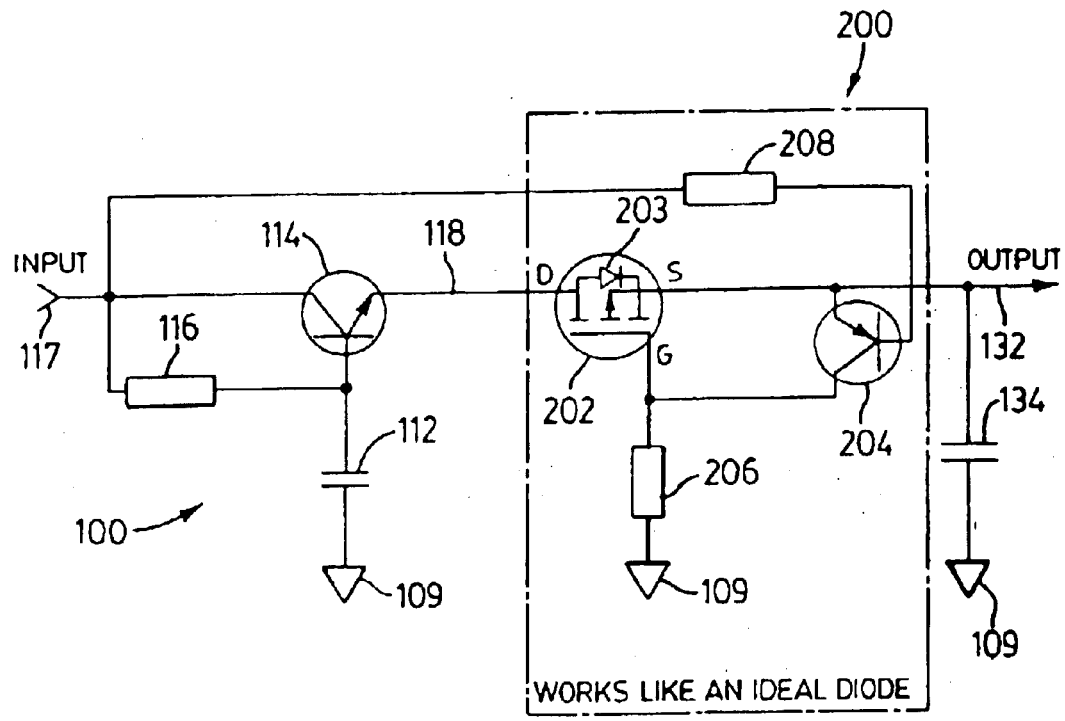
FIG. 3 is a schematic diagram showing a loss-less diode equivalent circuit according to another embodiment of the invention.

Reference is next made to FIG. 3, which shows in schematic form a loss-less diode equivalent circuit 200 according to another embodiment of the invention. The loss-less diode circuit 200 is again described in the context of the filter circuit 110 and like reference numerals indicate like elements for the filter circuit between FIGS. 1 and 2.

As shown in FIG. 3, the loss-less diode equivalent circuit 200 comprises a MOSFET transistor 202, a PNP transistor 204, and two resistors 206 and 208. The MOSFET transistor 202 has an internal diode indicated by reference 203. The MOSFET transistor 202 may be implemented using any MOSFET protected by an internal diode as most commercially available MOSFET devices are. The drain of the MOSFET transistor 202 is coupled to the output terminal 118 and the source of the MOSFET 202 is coupled to the output port 132. The source of the MOSFET 202 is also coupled to the collector of the PNP transistor 204. The gate of the MOSFET 202 is coupled to the emitter of the PNP transistor 204. The gate of the MOSFET 202 is also connected to one terminal of the resistor 206, and the other terminal of the resistor 206 is connected to the signal ground 109. The other resistor 208 is connected between the input port 117 and the base of the PNP transistor 204.

For the loss-less diode equivalent circuit 200 shown in FIG. 3, the anode is formed from the output terminal 118 and the cathode is formed from the output port terminal 132.

As compared to the loss-less diode circuit 100 of FIG. 2, the PNP transistor 124 has been eliminated and the emitter and collector connections for the PNP transistor 204 have been interchanged (as compared to the PNP transistor 126 in FIG. 2). In this configuration, the PNP transistor 204 is operated in reverse mode with a gain of one which is feasible if the resistance value for the resistor 208 can be reduced. The resistance for the resistor 206 is also reduced to between 10 KiloOhms to 100 KiloOhms. It will be appreciated that a reduced value for the resistor 206 results in a faster discharge for the capacitor 134 when the level of the input signal falls below the voltage of the capacitor 134.

In operation, the transistor 204 functions as a Zener diode, specifically the base-emitter junction, to protect the gate of the MOSFET 202 as described above. And in forward bias mode, the collector-base junction is utilized. Although, the collector-base junction introduces an additional voltage drop of 0.7 Volts, this does not impact operation of the circuit 200.

Figure 4:
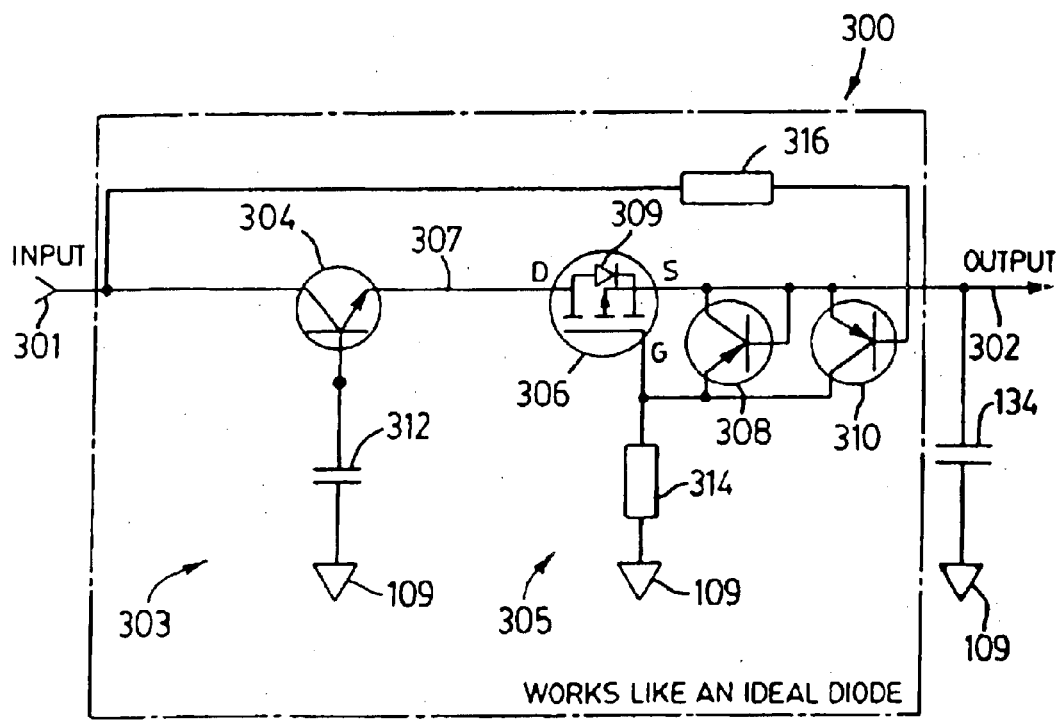
FIG. 4 is a schematic diagram showing a loss-less diode equivalent circuit according to a further embodiment of the invention.

Reference is next made to FIG. 4, which shows in schematic form another embodiment of a loss-less diode equivalent circuit 300 according to the present invention. The loss-less diode equivalent circuit 300 has an anode terminal indicated by reference 301 and a cathode terminal indicated by reference 302.

As shown in FIG. 4, the loss-less diode equivalent circuit 300 according to this embodiment comprises an input circuit 303 and a loss-diode circuit 305. The input circuit 301 includes a PNP transistor 304, and replaces the filter circuit 100 described above with reference to FIGS. 2 and 3. The loss-less diode circuit 305 is the same as the circuit described above with reference to FIG. 2 and comprises a MOSFET transistor 306, a PNP transistor 308, and a PNP transistor 310. The emitter of the PNP transistor 304 is connected to the anode terminal 301. The anode terminal 301 also forms the input port for the diode equivalent circuit 300. The base of the PNP transistor 304 is coupled to the signal ground 109 through a resistor 312. The collector of the PNP transistor 304 is coupled to the drain of the MOSFET 306, and this connection is indicated by node 307. The MOSFET 306 is a P-channel device which is reverse connected as described above, and includes an internal diode indicated by reference 309. The source of the MOSFET 306 is connected to the collector of the PNP transistor 308. The collector and base of the PNP transistor 308 are tied together to form a Zener diode which clamps at approximately 10 Volts as described above. The emitter of the PNP transistor 308 and to the collector of the PNP transistor 310 are tied together and also connected to the gate of the MOSFET 306. The gate of the MOSFET 306 is coupled to signal ground 109 through a resistor 314. Another resistor 316 is coupled between the emitter of the PNP transistor 304 and the base of the PNP transistor 310. The emitter of the PNP transistor 310 is coupled to the capacitor 134. The emitter of the PNP transistor 310 forms the cathode 302 and functions as the output port.

The input circuit 303 of FIG. 4 is configured so that the PNP transistor 304 is connected in reverse and operates in saturation mode. In reverse polarity, the transistor 304 has a gain of approximately one, and as such also exhibits the characteristics of a loss-less diode provided the input at the input port, i.e. the anode 301, does not drop more than 5 Volts below the voltage at the node 307. To provide loss-less diode operation below the 5 Volts threshold, the loss-diode circuit 303 comprising the MOSFET 306, and the transistors 308 and 310 are provided and function as described above.

Figure 5:
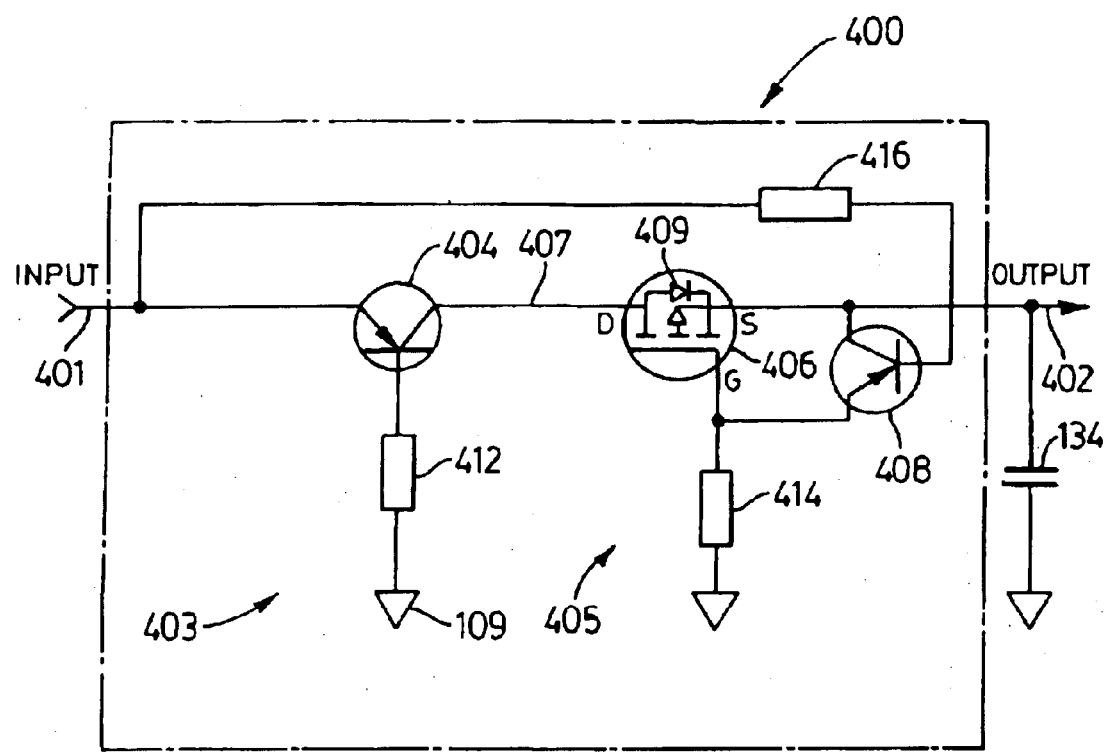
FIG. 5 is a schematic diagram showing a loss-less diode equivalent circuit according to yet another embodiment of the invention.

Reference is next made to FIG. 5, which shows in schematic form another embodiment of a loss-less diode equivalent circuit 400 according to the present invention. The loss-less diode 400 has an anode terminal indicated by reference 401 and a cathode terminal indicated by reference 402.

As shown in FIG. 5, the loss-less diode equivalent circuit 400 according to this embodiment comprises an input circuit 403 and a loss-diode circuit 405. The input circuit 403 includes a PNP transistor 404, and replaces the filter circuit 100 described above with reference to FIG. 3. The loss-less diode circuit 405 is the same as the circuit described above with reference to FIG. 3 and comprises a MOSFET transistor 406 and a PNP transistor 408. The emitter of the PNP transistor 404 is connected to the anode terminal 401. The anode terminal 401 also forms the input port for the diode equivalent circuit 400. The base of the PNP transistor 404 is coupled to the signal ground 109 through a resistor 412. The collector of the PNP transistor 404 is coupled to the drain of the MOSFET 406, and this connection is indicated by node 407. As described above, the MOSFET 406 is a P-channel device which is reverse connected, and includes an internal diode indicated by reference 409. The source of the MOSFET 406 is connected to the collector of the PNP transistor 408. The gate of the MOSFET 406 is coupled to the signal ground 109 through a resistor 414. The gate of the MOSFET 406 is also connected to the emitter of the PNP transistor 408. The base of the PNP transistor 408 is coupled to the anode 401, i.e. the input terminal, through a resistor 416. The cathode terminal 402 forms the output port and is connected to one terminal of the storage capacitor 134. The other terminal of the storage capacitor 134 is coupled to the signal ground 109.

In operation, the input circuit 403 functions in the same fashion as the input circuit 303 described above with reference to FIG. 4. The loss-less diode circuit 405 functions in the same fashion as the loss-less diode circuit 200 described above with reference to FIG. 3.

The present invention may be embodied in other specific forms without departing from the spirit or essential characteristics thereof. Certain adaptations and modifications of the invention will be obvious to those skilled in the art. Therefore, the above discussed embodiments are considered to be illustrative and not restrictive, the scope of the invention being indicated by the appended claims rather than the foregoing description, and all changes which come within the meaning and range of equivalency of the claims are therefore intended to be embraced therein.

What is claimed is:

1. A loss-less diode circuit comprising:
   (a) an input stage having an input port and an output node, said input port being adapted for receiving an input signal;
   (b) a diode equivalent circuit having an input, said input being coupled to said output node, said diode equivalent circuit including a reverse connected field effect transistor having a first terminal forming said input coupled to said output node, a second terminal forming an output, and a third terminal providing a control input, said field effect transistor having a diode providing a conduction path between said first and said second terminals when said field effect transistor is in an off state, and said control input being coupled to said input port through a transistor;
   (c) said diode equivalent circuit including a clamping device, said clamping device being coupled to the third terminal of said field effect transistor and providing a clamping voltage to protect said third terminal; and
   (d) the second terminal of said field effect transistor providing an output port for said circuit, and said output port being adapted for coupling to a capacitor and said capacitor being charged by the input signal applied to said input port.

2. The loss-less diode circuit as claimed in claim 1, wherein said input stage comprises a filter circuit including a bipolar junction transistor having a collector, an emitter and a base, said collector forming said input port, said emitter forming said output node, and said base being coupled to said collector through a resistor, and said base being coupled to signal ground through a capacitor.

3. The loss-less diode circuit as claimed in claim 1, wherein said field effect transistor comprises a P-channel MOSFET device having a drain, a source and a gate, and said first terminal comprises the drain, the second terminal comprises the source, and the third terminal comprises the gate, and said diode comprises an internal diode coupled across the drain and the source of said MOSFET device.

4. The loss-less diode circuit as claimed in claim 3, wherein said clamping device comprises a Zener diode and the transistor, said Zener diode having a cathode coupled to the source of said MOSFET device, and an anode coupled to the gate of said MOSFET device, and said transistor is a bipolar junction transistor having an emitter coupled to said cathode, a collector coupled to said anode and to the gate of said MOSFET device, and a base coupled to said input port through a resistor, and the emitter of said bipolar junction transistor providing said output port.

5. The loss-less diode circuit as claimed in claim 3, wherein said clamping device comprises a bipolar junction transistor having a collector, an emitter and a base, the emitter being coupled to the gate of said MOSFET device, and the collector being coupled to the source of said MOSFET device, and said bipolar junction transistor being operated in reverse mode, and said collector forming said output port.

6. The loss-less diode circuit as claimed in claim 5, wherein said input stage comprises a bipolar junction transistor having an emitter, a collector and a base, said emitter forming said input port, said base being coupled to signal ground, and said collector forming said output node, and said emitter being coupled to the base of said bipolar junction transistor for said clamping device.

7. A loss-less diode circuit comprising:
(a) an input stage having an input port and an output node, said input port being adapted for receiving an input signal;
(b) a diode equivalent circuit having an input, said input being coupled to said output node, said diode equivalent circuit including a reverse connected MOSFET device, said MOSFET device having a drain, a source and a gate, said drain being coupled to said output node, said gate being coupled to signal ground through a resistor, and said MOSFET device including an internal diode coupled between said drain and said source and providing a conduction path when said MOSFET device is in an off state;
(c) said diode equivalent circuit including a Zener diode and a bipolar junction transistor, said Zener diode having a cathode and an anode, said cathode being coupled to the source of said MOSFET device, said anode being coupled to the gate of said MOSFET device, and said bipolar junction transistor having an emitter, a collector and a base, said emitter being coupled to said cathode and the source of said MOSFET device, said collector being coupled to said anode and the gate of said MOSFET device and said base being coupled to said input port through a resistor; and
(d) the source of said MOSFET device providing an output port for said circuit, and said output port being adapted for coupling to a capacitor and said capacitor being charged by the input signal applied to said input port.

8. The loss-less diode circuit as claimed in claim 7, wherein said MOSFET device comprises a P-channel device.

9. The loss-less diode circuit as claimed in claim 8, wherein said Zener diode comprises a bipolar junction transistor having a collector, an emitter and a base, said collector and said base being coupled together to form a diode connected transistor.

10. The loss-less diode circuit as claimed in claim 9, wherein said diode-connected transistor comprises a PNP junction transistor.

11. A loss-less diode circuit comprising:
(a) an input stage having an input port and an output node, said input port being adapted for receiving an input signal;
(b) a diode equivalent circuit having an input, said input being coupled to said output node, said diode equivalent circuit including a reverse connected MOSFET device, said MOSFET device having a drain, a source and a gate, said drain being coupled to said output node, said gate being coupled to signal ground through a resistor, and said MOSFET device including an internal diode coupled between said drain and said source;
(c) said diode equivalent circuit including a first bipolar junction transistor, said first bipolar junction transistor having an emitter, a collector and a base, said collector being coupled to the source of said MOSFET device, said emitter being coupled to the gate of said MOSFET device and said base being coupled to the input port through a resistor; and
(d) the source of said MOSFET device providing an output port for said circuit, and said output port being adapted for coupling to a capacitor and said capacitor being charged by the input signal applied to said input port.

12. The loss-less diode circuit as claimed in claim 11, wherein said input stage comprises a filter circuit including a second bipolar junction transistor having a collector, an emitter and a base, said collector forming said input port, said emitter forming said output node, and said base being coupled to said collector through a resistor, and said base being coupled to signal ground through a capacitor.

13. The loss-less diode circuit as claimed in claim 11, wherein said MOSFET device comprises a P-channel device.

14. The loss-less diode circuit as claimed in claim 13, wherein said first bipolar junction transistor comprises a PNP device.

15. The loss-less diode circuit as claimed in claim 14, wherein said input stage comprises a second bipolar junction transistor having an emitter, a collector and a base, said emitter forming said input port, said base being coupled to signal ground, and said collector forming said output node.

16. A loss-less diode circuit comprising:
(a) an input stage having an input port and an output node, said input port being adapted for receiving an input signal;
(b) a diode equivalent circuit having an input, said input being coupled to said output node, said diode equivalent circuit including a reverse connected field effect transistor having a first terminal forming said input coupled to said output node, a second terminal forming an output, and a third terminal providing a control input, said field effect transistor having a diode providing a conduction path between said first and said second terminals when said field effect transistor is in an off state;
(c) said diode equivalent circuit including a clamping device, said clamping device being coupled to the third terminal of said field effect transistor and providing a clamping voltage to protect said third terminal;

(d) the second terminal of said field effect transistor providing an output port for said circuit, and said output port being adapted for coupling to a capacitor and said capacitor being charged by the input signal applied to said input port;

(e) said field effect transistor comprising a P-channel MOSFET device having a drain, a source and a gate, and said first terminal comprises the drain, said second terminal comprises the source, and said third terminal comprises the gate, and said diode comprises an internal diode coupled across the drain and the source of said MOSFET device;

(f) said clamping device comprises a first bipolar junction transistor having a first collector, a first emitter and a first base, the first emitter being coupled to the gate of said MOSFET device, and the first collector being coupled to the source of said MOSFET device, and said first bipolar junction transistor being operated in reverse mode, and said first collector forming said output port; and (g) said input stage comprises a second bipolar junction transistor having a second emitter, a second collector and a second base, said second emitter forming said input port, said second base being coupled to signal ground, and said second collector forming said output node, and said second emitter being coupled to the first base of said first bipolar junction transistor for said clamping device.

* * * * *